(12) United States Patent
Yamashita

(10) Patent No.: US 9,287,850 B2
(45) Date of Patent: Mar. 15, 2016

(54) COMMUNICATION MODULE COMPRISED OF MULTIPLE INTERDIGITAL TRANSDUCER DUPLEXERS FOR WIRELESS COMMUNICATION UNIT

(75) Inventor: Takashi Yamashita, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 467 days.

(21) Appl. No.: 13/587,253

(22) Filed: Aug. 16, 2012

(65) Prior Publication Data

US 2013/0049882 A1    Feb. 28, 2013

(30) Foreign Application Priority Data

Aug. 22, 2011    (JP) .................. 2011-180788

(51) Int. Cl.
  *H03H 9/72* (2006.01)
  *H04B 1/52* (2015.01)
  *H04B 1/525* (2015.01)
(52) U.S. Cl.
  CPC ............ *H03H 9/725* (2013.01); *H04B 1/525* (2013.01)
(58) Field of Classification Search
  CPC ........... H03H 9/72; H03H 9/64; H03H 9/725; H01P 1/213; H04B 1/525
  USPC ................... 333/133, 193, 194–96
  See application file for complete search history.

(56) References Cited

U.S. PATENT DOCUMENTS

| | | | |
|---|---|---|---|
| 5,874,869 A * | 2/1999 | Ueda et al. ................. 333/193 |
| 6,366,179 B1 | 4/2002 | Kuroda | |
| 6,380,823 B1 | 4/2002 | Ikata et al. | |
| 6,766,149 B1 | 7/2004 | Hikita et al. | |
| 2001/0029648 A1 | 10/2001 | Ikada et al. | |
| 2002/0186097 A1* | 12/2002 | Sakuragawa et al. .......... 333/133 |
| 2004/0212453 A1* | 10/2004 | Tsutsumi et al. ............ 333/133 |
| 2006/0192632 A1 | 8/2006 | Nakai et al. | |
| 2007/0183348 A1 | 8/2007 | Totsuka et al. | |
| 2010/0188165 A1 | 7/2010 | Nakamura et al. | |

FOREIGN PATENT DOCUMENTS

| | | |
|---|---|---|
| CN | 1383608 A | 12/2002 |
| CN | 1540861 A | 10/2004 |
| CN | 1751447 A | 3/2006 |
| JP | H10-190390 A | 7/1998 |
| JP | 10-285075 A | 10/1998 |
| JP | 2000-59176 A | 2/2000 |
| JP | 2000-349586 A | 12/2000 |
| JP | 2001-85967 A | 3/2001 |

(Continued)

OTHER PUBLICATIONS

Chinese Office Action dated Apr. 25, 2014, in a counterpart Chinese patent application No. 201210298902.9.

(Continued)

*Primary Examiner* — Benny Lee
*Assistant Examiner* — Jorge Salazar, Jr.
(74) *Attorney, Agent, or Firm* — Chen Yoshimura LLP

(57) ABSTRACT

A communication module includes a plurality of duplexers, wherein at least either IDT electrodes of transmit filters of at least two of the plurality of duplexers having a different transmit band or IDT electrodes of receive filters of at least two of the plurality of duplexers having a different receive band are composed of a same material, have a same thickness and are provided on a single piezoelectric substrate.

10 Claims, 17 Drawing Sheets

(56) References Cited

FOREIGN PATENT DOCUMENTS

| | | |
|---|---|---|
| JP | 2001-156576 A | 6/2001 |
| JP | 2001-267868 A | 9/2001 |
| JP | 2001-352227 A | 12/2001 |
| JP | 2002-100960 A | 4/2002 |
| JP | 2007-134795 A | 5/2007 |
| JP | 2007-214718 A | 8/2007 |
| JP | 2010-10765 A | 1/2010 |
| JP | 2010-193135 A | 9/2010 |
| JP | 2011-9882 A | 1/2011 |
| WO | WO2011065199 A1 * | 6/2011 |

OTHER PUBLICATIONS

Japanese Office Action dated Mar. 17, 2015, in a counterpart Japanese patent application No. 2011-180788.

* cited by examiner

COMMUNICATION MODULE COMPRISED OF MULTIPLE INTERDIGITAL TRANSDUCER DUPLEXERS FOR WIRELESS COMMUNICATION UNIT

CROSS-REFERENCE TO RELATED APPLICATION

This application is based upon and claims the benefit of priority of the prior Japanese Patent Application No. 2011-180788, filed on Aug. 22, 2011, the entire contents of which are incorporated herein by reference.

FIELD

A certain aspect of the present invention relates to a communication module.

BACKGROUND

Recently, mobile phone units are being rapidly spread, as a mobile communication system develops. A wireless communication device such as the mobile phone unit covers multi-bands and is systemized. A single wireless communication has a plurality of communication devices. For example, a mobile phone unit covering a plurality of frequency bands is known. The mobile phone unit has a plurality of antenna duplexers in order to cover a plurality of frequency bands.

The antenna duplexer is used for separating a transmit signal and a receive signal having a different frequency, and has a transmit filter and a receive filter. Recently, an acoustic wave filter allowing downsizing is used as the transmit filter or the receive filter.

Generally, an antenna duplexer has a structure in which a transmit filter and a receive filter provided in different chips are mounted on a substrate. Recently, in view of simplification of mounting, an antenna duplexer in which a transmit filter and a receive filter are provided in a single chip is being manufactured. Japanese Patent Application Publications No. 2000-349586 and No. 2007-134795 disclose that in a structure in which two or more antenna duplexers are housed in a single package, transmit filters in the antenna duplexers are provided in a single chip, and receive filters in the antenna duplexers are provided in a single chip. Japanese Patent Application Publications No. 2011-9882 (hereinafter referred to as Document 3), No. 2001-267868, and No. H10-190390 disclose that a plurality of acoustic wave filters having an IDT (Interdigital Transducer) electrode having a different thickness and composed of a different material are provided in a single chip.

SUMMARY OF THE INVENTION

According to an aspect of the present invention, there is provided a communication module including a plurality of duplexers, wherein at least either IDT electrodes of transmit filters of at least two of the plurality of duplexers having a different transmit band or IDT electrodes of receive filters of at least two of the plurality of duplexers having a different receive band are composed of a same material, have a same thickness and are provided on a single piezoelectric substrate.

DETAILED DESCRIPTION

In view of simplification of mounting, it is preferable that a transmit filter and a receive filter of an antenna duplexer are provided in a single chip. When the transmit filter and the receive filter are provided in a single chip, the transmit filter and the receive filter are formed together with each other. Therefore, each IDT electrode is composed of the same material and has the same thickness.

High power durability is demanded for the transmit filter. Therefore, the IDT electrode of the transmit filter is composed of a material achieving the high power durability. In this case, the IDT electrode of the receive filter is also composed of the material achieving the high power durability. However, the high power durability is not demanded for the receive filter, compared to the transmit filter. When the IDT electrode of the receive filter is composed of the material achieving the high power durability, electrical resistance of the IDT electrode may increase and transmissions loss may be degraded.

When a transmit filter and a receive filter are provided in a single chip with use of the method disclosed in Document 3, the high durability of the transmit filter and low transmission loss of the receive filter are achieved. However, manufacturing processes may be complicated. Therefore, cost may increase.

Figure 1:
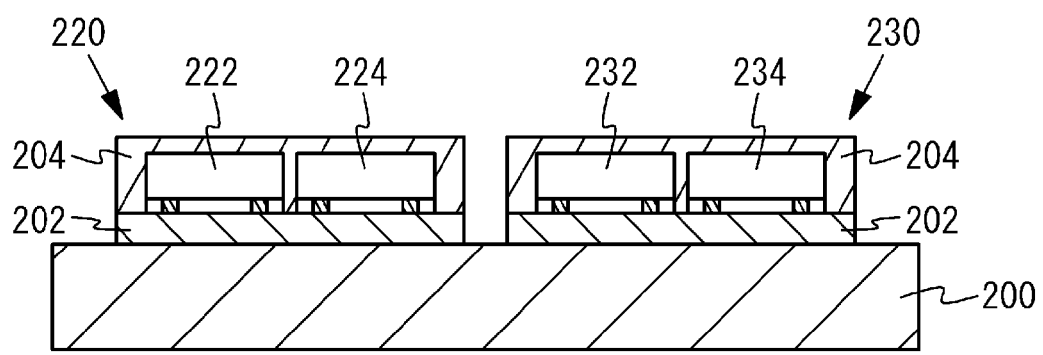
FIG. 1 illustrates a schematic cross sectional view of a communication module in accordance with a first comparative example.
Figure 2A:
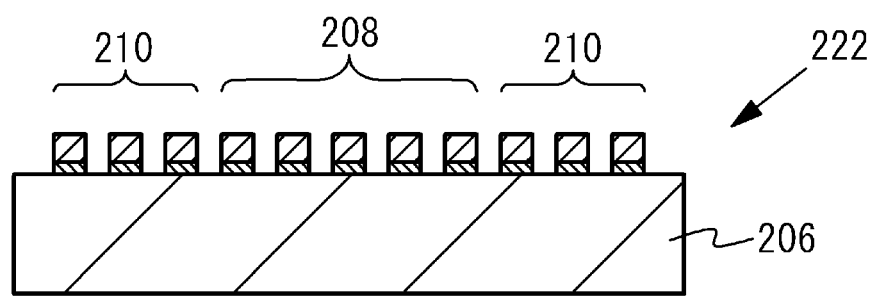
FIG. 2A and FIG. 2B illustrate a schematic cross sectional view of a transmit filter and a receive filter of a first duplexer of the communication module in accordance with the first comparative example.
Figure 2B:
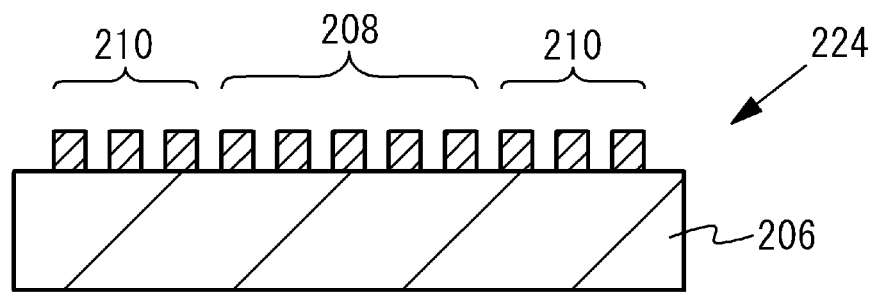

First, a description will be given of a communication module in accordance with a first comparative example. FIG. 1 illustrates a schematic cross sectional view of the communication module. FIG. 2A illustrates a schematic cross sectional view of a transmit filter of a first duplexer of the communication module. FIG. 2B illustrates a schematic cross sectional view of a receive filter of the first duplexer. As illustrated in FIG. 1, the communication module has two duplexers (a first duplexer 220 and a second duplexer 230) mounted on a printed substrate 200. Transmit-receive band of the first duplexer 220 is different from that of the second duplexer 230.

The first duplexer 220 has a first transmit filter 222 and a first receive filter 224 that are mounted on a substrate 202. A chip of the first transmit filter 222 is different from that of the first receive filter 224. The first transmit filter 222 and the first receive filter 224 are sealed by a sealing portion 204. The first transmit filter 222 and the first receive filter 224 are a surface acoustic wave filter or the like. As illustrated in FIG. 2A, the first transmit filter 222 has a structure in which an IDT electrode 208 is provided on a piezoelectric substrate 206, and reflection electrodes 210 are provided on the piezoelectric substrate 206 at both sides of the IDT electrode 208. The IDT electrode 208 and the reflection electrode 210 of the first transmit filter 222 have two-layer structure in which Ti and Al-1% Cu are laminated in this order from the piezoelectric substrate 206 side. As illustrated in FIG. 2B, the first receive filter 224 has the IDT electrode 208 and the reflection electrode 210 on the piezoelectric substrate 206, as well as the first transmit filter 222. The IDT electrode 208 and the reflection electrode 210 of the first receive filter 224 have a single-layer structure of Al-1% Cu or the like. "Al-1% Cu" is an alloy in which Cu is mixed into Al by 1 weight %.

The second duplexer 230 has a second transmit filter 232 and a second receive filter 234 that are mounted on the substrate 202. A chip of the second transmit filter 232 is different from that of the second receive filter 234. The second transmit filter 232 and the second receive filter 234 are sealed by the sealing portion 204. The second transmit filter 232 and the second receive filter 234 are a surface acoustic wave filter or the like. The schematic cross sectional view of the second transmit filter 232 and the second receive filter 234 is the same as that of the first transmit filter 222 and the first receive filter 224 illustrated in FIG. 2A and FIG. 2B. Therefore, the explanation is omitted.

High power-durability is demanded for a transmit filter. For the reason, the IDT electrodes 208 of the first transmit filter 222 and the second transmit filter 232 have the two-layer structure of Ti and Al-1% Cu in order to achieve the high power-durability. On the other hand, the high power-durability is not demanded for a receive filter compared to the transmit filter. For this reason, the IDT electrodes of the first receive filter 224 and the second receive filter 234 have the single-layer structure of Al-1% Cu in order to achieve low loss and low electric resistance.

In accordance with the first comparative example, the transmit filters of the first duplexer 220 and the second duplexer 230 are capable of achieving the high power-durability, and the receive filters of the first duplexer 220 and the second duplexer 230 are capable of achieving low transmission loss allowed by low electric resistance. An optimal thickness of the IDT electrode of the surface acoustic wave filter fluctuates according to a frequency band. However, the thickness of the IDT electrode can be optimized because the chip of the transmit filters is different from that of the receive filters, with respect to the first duplexer 220 and the second duplexer 230. However, the transmit filters and the receive filters of the first duplexer 220 and the second duplexer 230 are manufactured separately and are mounted separately. Therefore, the number of processes of manufacturing and mounting may be increased, and the cost may be increased.

Figure 3:
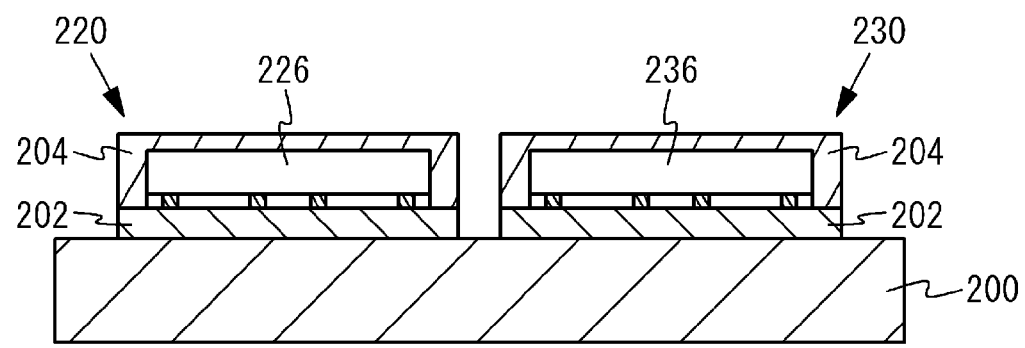
FIG. 3 illustrates a schematic cross sectional view of a communication module in accordance with a second comparative example.
Figure 4:
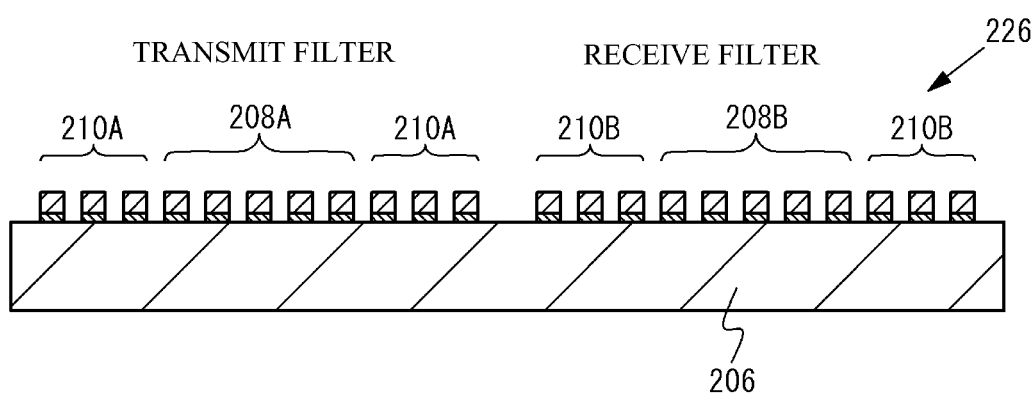
FIG. 4 illustrates a schematic cross sectional view of a transmit-receive chip of a first duplexer of the communication module in accordance with the second comparative example.

Next, a description will be given of a communication module in accordance with a second comparative example. FIG. 3 illustrates a schematic cross sectional view of the communication module. FIG. 4 illustrates a schematic cross sectional view of a transmit-receive chip of a first duplexer of the communication module. As illustrated in FIG. 3, the communication module of the second comparative example is different from the communication module of the first comparative example in a point that the transmit filter and the receive filter are provided in a single chip in the first duplexer 220 and the second duplexer 230. Hereinafter, the single chip including a transmit filter and a receive filter is referred to as a transmit-receive chip. The transmit-receive chip of the first duplexer 220 is referred to as a first transmit-receive chip 226. The transmit-receive chip of the second duplexer 230 is referred to as a second transmit-receive chip 236.

As illustrated in FIG. 4, the first transmit-receive chip 226 has a structure in which an IDT electrode 208A and a reflection electrode 210A of the transmit filter and an IDT electrode 208B and a reflection electrode 210B of the receive filter are provided on the single piezoelectric substrate 206. Generally, in this case, the IDT electrode 208A of the transmit filter and the IDT electrode 208B of the receive filter are formed together with each other. Therefore, the IDT electrode 208A of the transmit filter and the IDT electrode 208B of the receive filter are composed of the same material and have the same thickness. The second transmit-receive chip 236 has the same cross section as the first transmit-receive chip 226. FIG. 4 illustrates the cross sectional view. Therefore, the explanation is omitted.

The high power-durability is demanded for the transmit filter and is essential for an antenna duplexer. Therefore, the IDT electrode 208A of the transmit filter has the two-layer structure of Ti and Al-1% Cu in order to achieve the high power-durability in the first transmit-receive chip 226 and the second transmit-receive chip 236. The IDT electrode 208B of the receive filter has the two-layer structure of Ti and Al-1% Cu, because the IDT electrode 208B of the receive filter is formed together with the IDT electrode 208A of the transmit filter.

In accordance with the second comparative example, the transmit filter and the receive filter are provided in a single chip, and the IDT electrodes of the transmit filter and the receive filter are formed together with each other. Therefore, the process of manufacturing and mounting can be simplified. The transmit filter of the first duplexer 220 and the second duplexer 230 is capable of achieving the high power-durability. However, the IDT electrode 208B of the receive filter also has the two-layer structure of Ti and Al-1% Cu. Therefore, the electric resistance gets larger and the transmission loss gets degraded, compared to the case where the IDT electrode of the receive filter has the single-layer structure of Al-1% Cu as in the case of the first comparative example.

Figure 5:
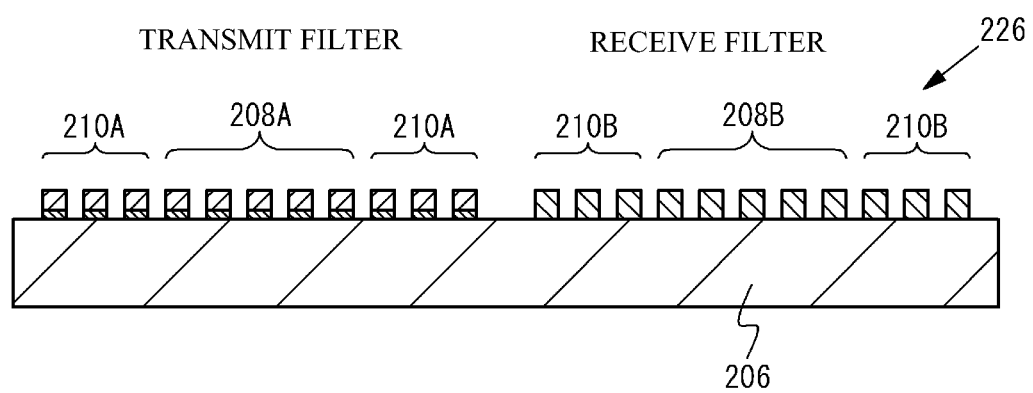
FIG. 5 illustrates a cross sectional view of a transmit-receive chip of a first duplexer of a communication module in accordance with a third comparative example.

Next, a description will be given of a communication module in accordance with a third comparative embodiment. The communication module of the third comparative example has the same cross section as the communication module of the second comparative example. FIG. 3 illustrates the cross section. Therefore, the explanation is omitted. FIG. 5 illustrates a cross sectional view of a transmit-receive chip of the first duplexer of the communication module of the third comparative example. The transmit-receive chip of the second duplexer has the same cross section as the transmit-receive chip of the first duplexer. Therefore, the explanation is omitted.

As illustrated in FIG. 5, the first transmit-receive chip 226 is different from the communication module of the second comparative example in points that the IDT electrode 208A and the reflection electrode 210A of the transmit filter have the two-layer structure of Ti and Al-1% Cu, and the IDT electrode 208B and the reflection electrode 210B of the receive filter have the single-layer structure of Al-1% Cu.

Figure 6A:
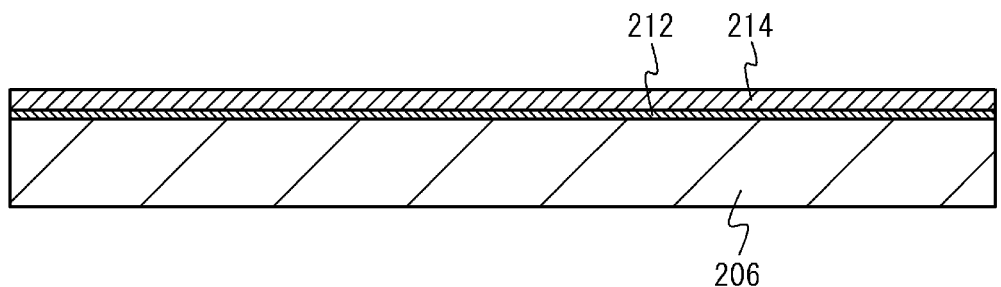
FIG. 6A through FIG. 6C illustrate a schematic cross sectional view illustrating a manufacturing method of a first transmit-receive chip.
Figure 6B:
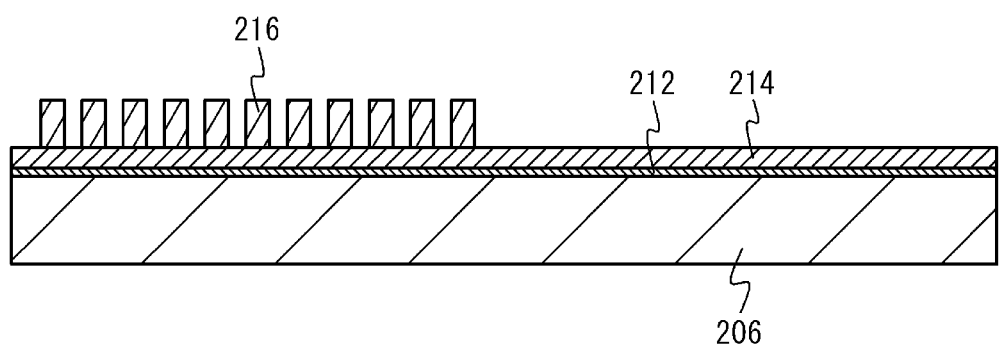

FIGS. 6A, 6B, 6C, 7A, 7B, and 7C illustrate a schematic cross sectional view illustrating a manufacturing method of the first transmit-receive chip 226. As illustrated in FIG. 6A, a Ti film 212 and an Al-1% Cu film 214 are formed on the piezoelectric substrate 206 in this order by sputtering or the like. As illustrated in FIG. 6B, a resist 216 is formed on the Al-1% Cu film 214. And, the resist 216 is formed into a pattern. In the process, the resist 216 is formed into the pattern so that regions to be the IDT electrode 208A and the reflection electrode 210A of the transmit filter are protected.

Figure 6C:
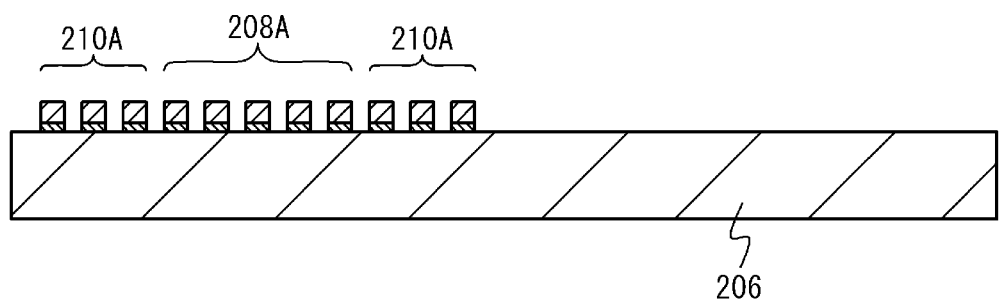

As illustrated in FIG. 6C, the Ti film 212 and the Al-1% Cu film 214 are subjected to an etching process with use of the resist 216 as a mask. Thus, the IDT electrode 208A and the reflection electrode 210A of the transmit filter are formed. In the region of the receive filter, all of the Ti film 212 and the Al-1% Cu film 214 are removed. And, an upper face of the piezoelectric substrate 206 is exposed.

Figure 7A:
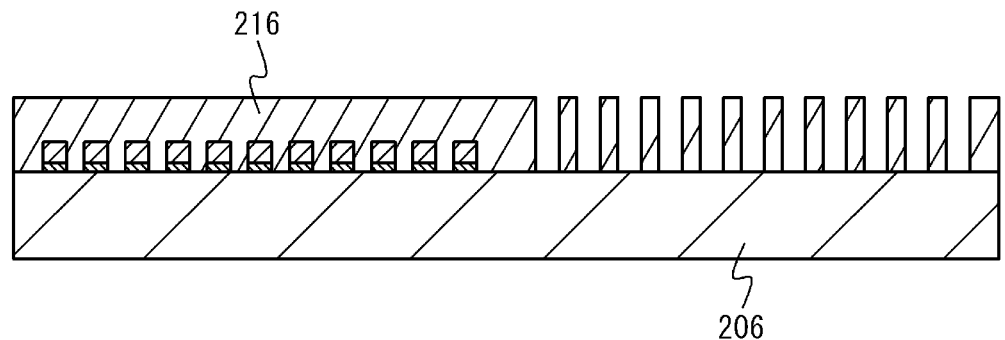
FIG. 7A through FIG. 7C illustrate a schematic cross sectional view illustrating the manufacturing method of the first transmit-receive chip.

As illustrated in FIG. 7A, the resist 216 is formed on the piezoelectric substrate 206, the IDT electrode 208A and the reflection electrode 210A. And the resist 216 is formed into a pattern. In the process, the resist 216 is formed into the pattern so that regions on the piezoelectric substrate 206 where the IDT electrode 208B and the reflection electrode 210B are to be formed are exposed.

Figure 7B:
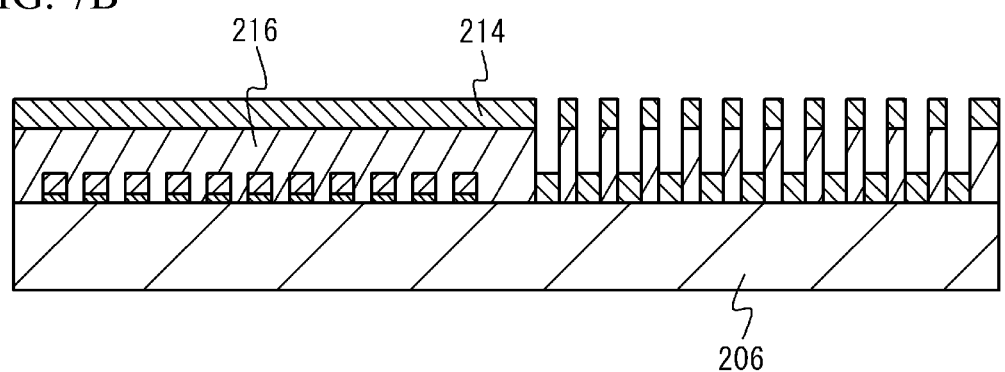
Figure 7C:
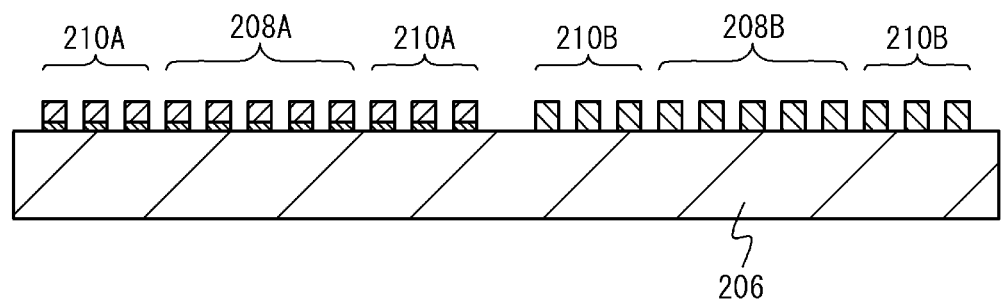

As illustrated in FIG. 7B, the Al-1% Cu film 214 is formed on the piezoelectric substrate 206 and the resist 216 by a chemical vapor deposition method or the like. As illustrated in FIG. 7C, the resist 216 and the Al-1% Cu film 214 on the resist 216 are removed by a lift-off method or the like. Thus, the IDT electrode 208B and the reflection electrode 210B of the receive filter are formed. Through the processes, the first transmit-receive chip 226 is formed. The IDT electrode 208B and the reflection electrode 210B of the receive filter may be formed by an etching method or the like. The IDT electrode 208A and the reflection electrode 210A of the transmit filter may be formed by a lift-off method or the like.

In accordance with the third comparative example, the transmit filter and the receive filter are provided in a single chip. Therefore, the mounting process can be simplified. The transmit filters are capable of achieving the high power-durability, and receive filters are capable of achieving low transmission loss allowed by low electric resistance, in the first duplexer 220 and the second duplexer 230. However, the number of processes gets larger and the cost is increased, because the manufacturing processes of FIGS. 6A, 6B, 6C, 7A, 7B, and 7C are needed.

A description will be given of a communication module having an antenna duplexer achieving the high power-durability of a transmit filter and low transmission loss of a receive filter without increasing of cost.

First Embodiment

Figure 8:
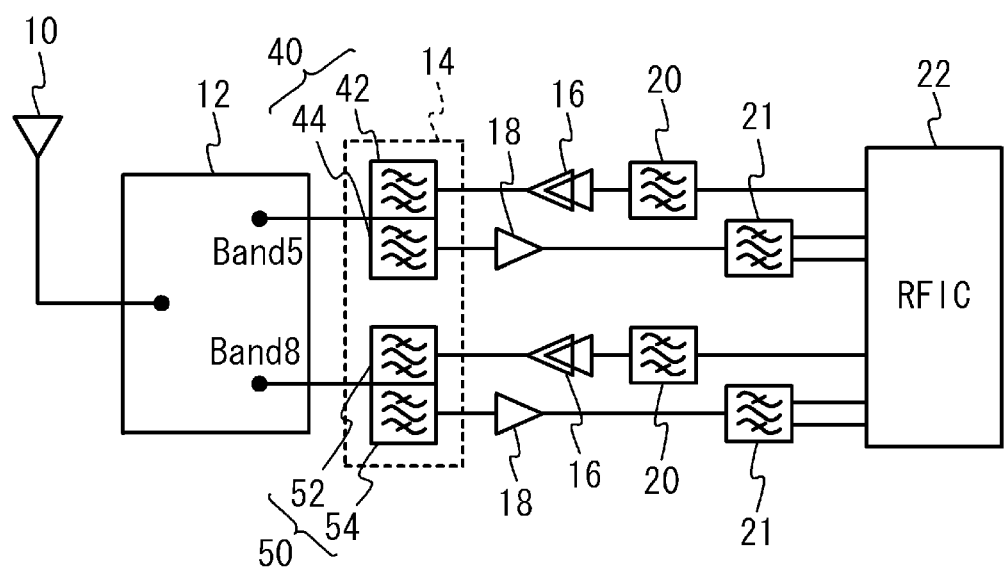
FIG. 8 illustrates a block diagram of a wireless communication unit having a communication module in accordance with a first embodiment.

FIG. 8 illustrates a block diagram of a wireless communication unit having a communication module in accordance with a first embodiment. As illustrated in FIG. 8, the wireless communication unit has an antenna 10, an antenna switch 12, a communication module 14 of the first embodiment, a power amplifier 16, a low noise amplifier 18, filters 20 and 21, and an RFIC 22. The communication module 14 has a first duplexer 40 and a second duplexer 50. The first duplexer 40 has a first transmit filter 42 and a first receive filter 44. The second duplexer 50 has a second transmit filter 52 and a second receive filter 54. The first transmit filter 42 and the second transmit filter 52 are a surface acoustic wave filter of a ladder type. The first receive filter 44 and the second receive filter 54 are a surface acoustic wave filter of a double mode coupling type.

The transmit-receive band of the first duplexer 40 is different from that of the second duplexer 50 and is not overlapped with that of the second duplexer 50. That is, the transmit band of the first transmit filter 42 is different from that of the second transmit filter 52 and is not overlapped with that of the second transmit filter 52. The receive band of the first receive filter 44 is different from that of the second receive filter 54 and is not overlapped with that of the second receive filter 54. For example, the first duplexer 40 is a duplexer of Band 5 of WCDMA (Wideband Code Division Multiple Access) system. The second duplexer 50 is a duplexer of Band 8 of the WCDMA system. That is, the transmit band of the first transmit filter 42 is 824 to 849 MHz. The receive band of the first receive filter 44 is 869 to 894 MHz. The transmit band of the second transmit filter 52 is 880 to 915 MHz. The receive band of the second receive filter 54 is 925 to 960 MHz.

The first duplexer 40 and the second duplexer 50 are connected to the antenna switch 12 via an antenna terminals (Band 5 and Band 8). The antenna switch 12 is connected to the antenna 10. Thus, the antenna switch 12 is capable of selecting a duplexer that is electrically connected to the antenna 10 from the first duplexer 40 and the second duplexer 50.

The first transmit filter 42 and the second transmit filter 52 are connected to the RFIC 22 via the power amplifier 16 and the filter 20. The filter 20 connected to the first transmit filter 42 is a band pass filter that selectively allows passing of the same pass band as the first transmit filter 42. The filter 20 connected to the second transmit filter 52 is a band pass filter that selectively allows passing of the same pass band as the second transmit filter 52.

The first receive filter 44 and the second receive filter 54 are connected to the RFIC 22 via the low noise amplifier 18 and the filter 21. The filter 21 connected to the first receive filter 44 is a band pass filter that selectively allows passing of the same pass band as the first receive filter 44. The filter 21 connected to the second receive filter 54 is a band pass filter that selectively allows passing of the same pass band as the second receive filter 54.

A description will be given of transmitting and receiving of a transmit signal and a receive signal of the WCDMA. The RFIC 22 outputs a transmit signal of high frequency wave to the filter 20. The filter 20 filters the transmit signal and outputs the filtered transmit signal to the power amplifier 16. The power amplifier 16 amplifies the transmit signal and outputs the amplified transmit signal to the first duplexer 40 (or the second duplexer 50). The first duplexer 40 (or the second duplexer 50) filters the transmit signal and outputs the filtered transmit signal to the antenna terminal of the antenna switch 12. The antenna switch 12 outputs a receive signal to the antenna terminal. The first duplexer 40 (or the second duplexer 50) filters the receive signal and outputs the filtered receive signal to the low noise amplifier 18. The low noise amplifier 18 amplifies the receive signal and outputs the amplified receive signal to the filter 21. The filter 21 filters the receive signal and outputs the filtered receive signal to the RFIC 22. The filter 21 may output a balanced signal. In this way, each transmit filter of the first duplexer 40 and the second duplexer 50 allows passing of the transmit signal output from the RFIC 22, but does not allow passing of the receive signal input to the antenna terminal. Each receive filter of the first duplexer 40 and the second duplexer 50 allows passing of the receive signal input to the antenna terminal, but does not allow passing of the transmit signal output from the RFIC 22.

Figure 9:
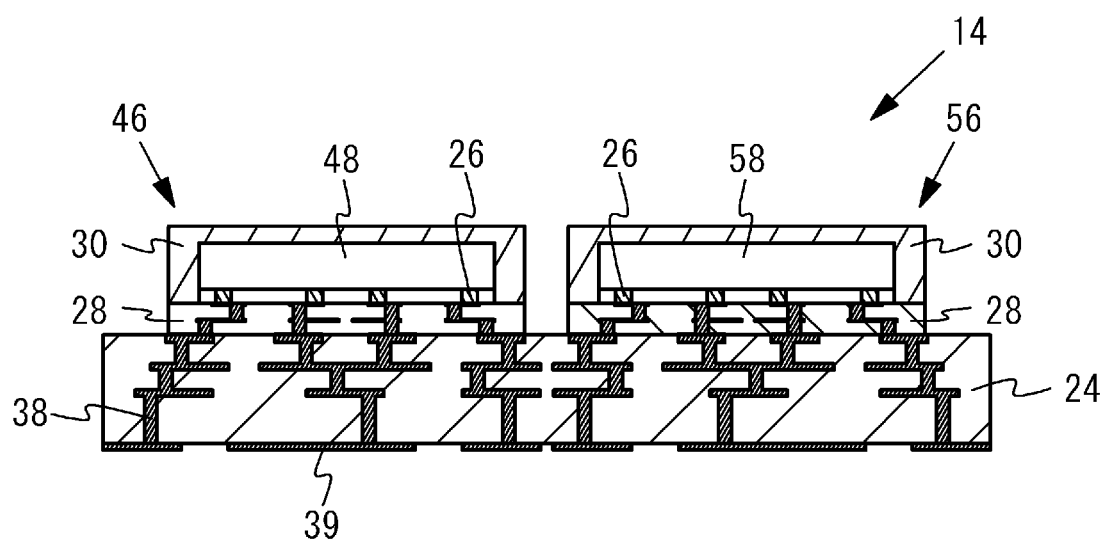
FIG. 9 illustrates a schematic cross sectional view of the communication module in accordance with the first embodiment.

FIG. 9 illustrates a schematic cross sectional view of the communication module 14. As illustrated in FIG. 9, in the communication module 14, a transmit package 46 and a receive package 56 are mounted on a printed substrate 24. The transmit package 46 has a structure in which a transmit chip 48 is flip-chip mounted on a substrate 28 composed of HTCC (High Temperature Co-fired Ceramics) or the like through a bump 26 composed of Au or the like. Similarly, the receive package 56 has a structure in which a receive chip 58 is flip-chip mounted on the substrate 28 through the bump 26. The transmit chip 48 and the receive chip 58 are sealed by a seal portion 30 composed of a molding resin or the like. The substrate 28 may be a substrate other than the HTCC. For example, a substrate or a printed substrate composed of LTCC (Low Temperature Co-fired Ceramics) may be used as the substrate 28. The transmit chip 48 and the receive chip 58 may be sealed by a top board composed of a resin or the like instead of the molding resin.

Figure 10A:
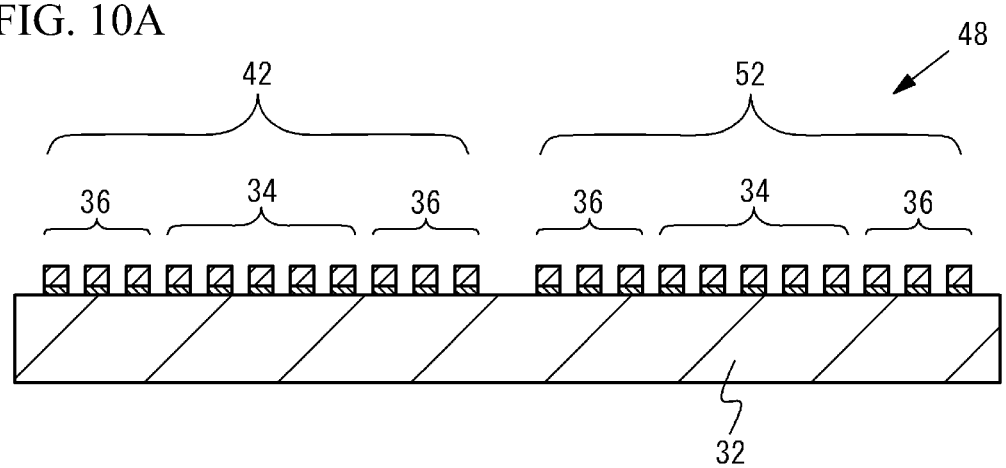
FIG. 10A illustrates a schematic cross sectional view of a transmit chip.
Figure 10B:
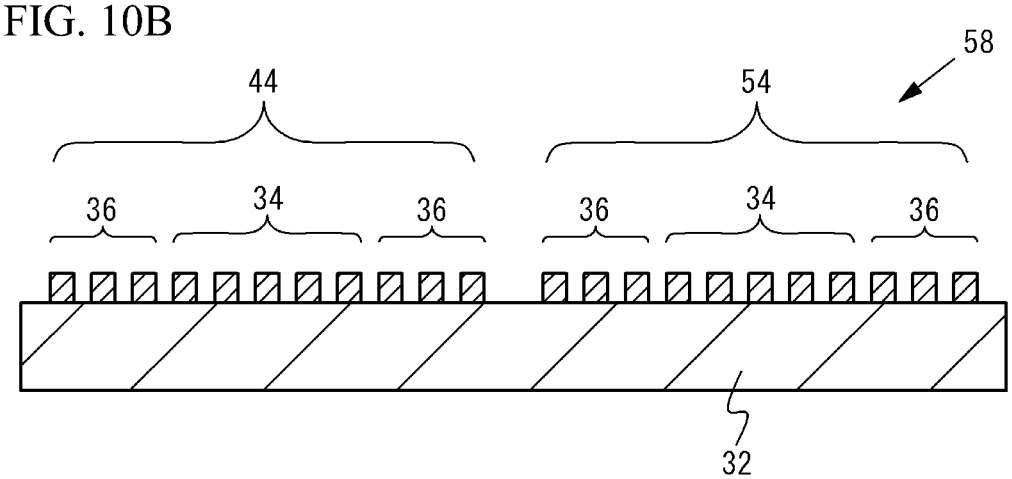
FIG. 10B illustrates a schematic cross sectional view of a receive chip.

Next, a description will be given of the transmit chip 48 and the receive chip 58. FIG. 10A illustrates a schematic cross sectional view of the transmit chip 48. FIG. 10B illustrates a schematic cross sectional view of the receive chip 58. As illustrated in FIG. 10A, the transmit chip 48 has a structure in which an IDT electrode 34 and a reflection electrode 36 of the first transmit filter 42 and the IDT electrode 34 and the reflection electrode 36 of the second transmit filter 52 are provided on a single piezoelectric substrate 32 composed of LT (lithium tantalate), LN (lithium niobate) or the like. The reflection electrode 36 is provided at both sides of the IDT electrode 34 in a propagation direction of an acoustic wave. The IDT electrode 34 and the reflection electrode 36 have a two-layer structure in which Ti and Al-1% Cu are laminated in this order from the piezoelectric substrate 32 side. In the IDT electrode 34 and the reflection electrode 36, the Ti has a thickness of 160 nm, and the Al-1% Cu has a thickness of 210 nm. Therefore, the total thickness of the IDT electrode 34 and the reflection electrode 36 is 370 nm. Thus, the IDT electrodes 34 of the first transmit filter 42 and the second transmit filter 52 are provided on the single piezoelectric substrate 32, are composed of the same material, have the same number of layers, and have the same thickness.

An optimal thickness of an IDT electrode fluctuates according to a frequency, with respect to a surface acoustic wave filter. The transmit band of the first transmit filter 42 is 824 to 849 MHz. The transmit band of the second transmit filter 52 is 880 to 915 MHz. In a precise sense, the optimal thickness of the IDT electrode 34 of the first transmit filter 42 may be different from that of the IDT electrode 34 of the second transmit filter 52. However, the transmit band of the first transmit filter 42 is close to that of the second transmit filter 52. The optimal thickness of the IDT electrode of the first transmit filter 42 is close to that of the IDT electrode of the second transmit filter 52. Therefore, the thickness of the IDT electrode 34 of the first transmit filter 42 may be the same as that of the IDT electrode 34 of the second transmit filter 52. In this case, it is preferable that the common thickness of the IDT electrodes 34 of the first transmit filter 42 and the second transmit filter 52 is an average between the optimal thickness of the IDT electrode with respect to the transmit band of the first transmit filter 42 and the optimal thickness of the IDT electrode with respect to the transmit band of the second transmit filter 52.

As illustrated in FIG. 10B, the receive chip 58 has a structure in which the IDT electrode 34 and the reflection electrode 36 of the first receive filter 44 and the IDT electrode 34 and the reflection electrode 36 of the second receive filter 54 are provided on another single piezoelectric substrate 32 composed of LT, LN or the like. The reflection electrode 36 is provided at both sides of the IDT electrode 34 in a propagation direction of an acoustic wave. The IDT electrode 34 and the reflection electrode 36 have a single-layer structure of Al-1% Cu or the like. In the IDT electrode 34 and the reflection electrode 36, the Al-1% Cu has a thickness of 372.5 nm. Therefore, the IDT electrodes 34 of the first receive filter 44 and the second receive filter 54 are provided on the single piezoelectric substrate 32, are composed of the same material, have the same number of layer, and have the same thickness.

The receive band of the first receive filter 44 (869 to 894 MHz) is close to the receive band of the second receive filter 54 (925 to 960 MHz). The optimal thickness of the IDT electrode 34 of the first receive filter 44 is close to that of the IDT electrode 34 of the second receive filter 54. Therefore, the thickness of the IDT electrode 34 of the first receive filter 44 may be the same as that of the IDT electrode 34 of the second receive filter 54. In this case, it is preferable that the common thickness of the IDT electrodes 34 of the first receive filter 44 and the second receive filter 54 is an average between the optimal thickness of the IDT electrode with respect to the receive band of the first receive filter 44 and the optimal thickness of the IDT electrode with respect to the receive band of the second receive filter 54.

Figure 11A:
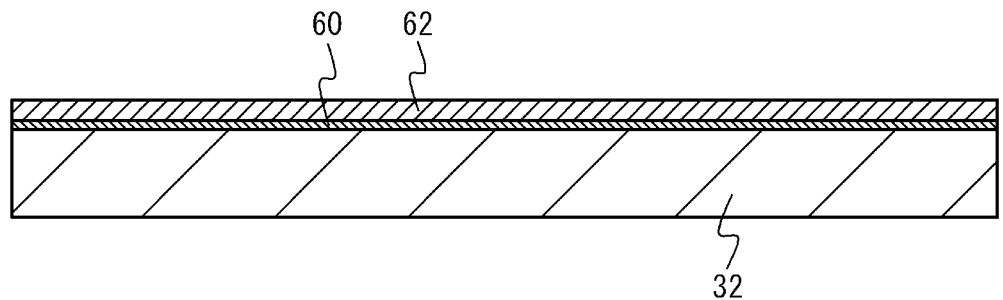
FIG. 11A through FIG. 11C illustrate a schematic cross sectional view of a first manufacturing method of a transmit chip.
Figure 11B:
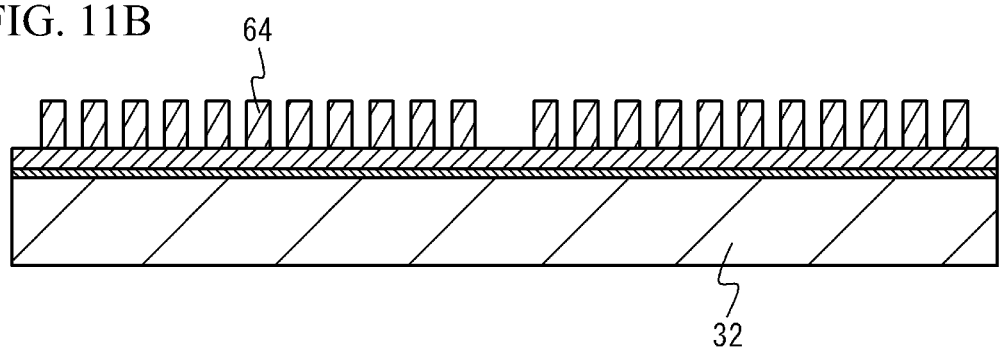
Figure 11C:
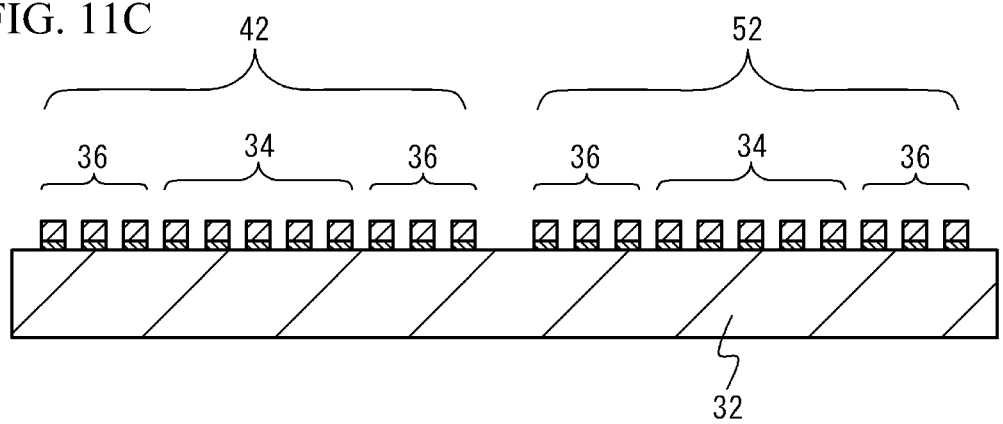

Next, a description will be given of a method for manufacturing the transmit chip 48. The receive chip 58 can be manufactured by the same method as the transmit chip 48. Therefore, the method for manufacturing the receive chip 58 is omitted. FIG. 11A through FIG. 11C illustrate a schematic cross sectional view of a first method for manufacturing the transmit chip 48. As illustrated in FIG. 11A, a Ti film 60 and an Al-1% Cu film 62 are formed on the piezoelectric substrate 32 in this order by a sputtering method or the like.

As illustrated in FIG. 11B, a resist 64 is formed on the Al-1% Cu film 62 and is formed into a pattern. In this case, the resist 64 is formed into the pattern so that regions to be the IDT electrode 34 and the reflection electrode 36 of the first transmit filter 42 and the IDT electrode 34 and the reflection electrode 36 of the second transmit filter 52 are protected.

As illustrated in FIG. 11C, the Ti film 60 and the Al-1% Cu film 62 are subjected to an etching process with use of the resist 64 as a mask. Thus, the IDT electrode 34 and the reflection electrode 36 of the first transmit filter 42 and the IDT electrode 34 and the reflection electrode 36 of the second transmit filter 52 that are composed of the same material, have the same number of layers and have the same thickness are formed on the single piezoelectric substrate 32 together with each other.

Figure 12A:
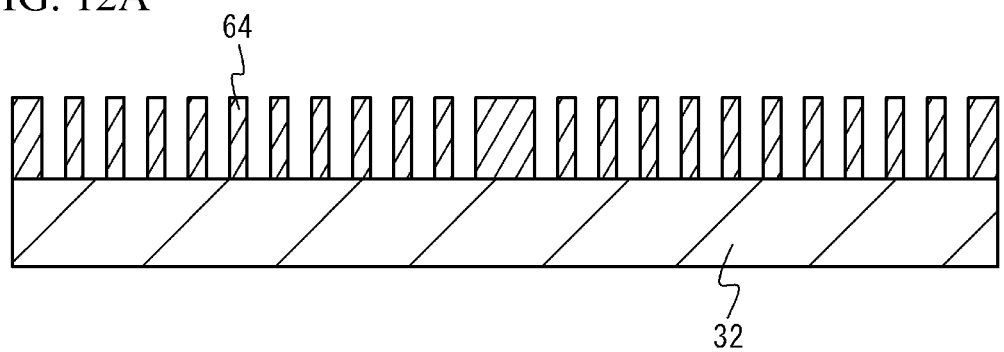
FIG. 12A through FIG. 12C illustrate a schematic cross sectional view of a second manufacturing method of a transmit chip.
Figure 12B:
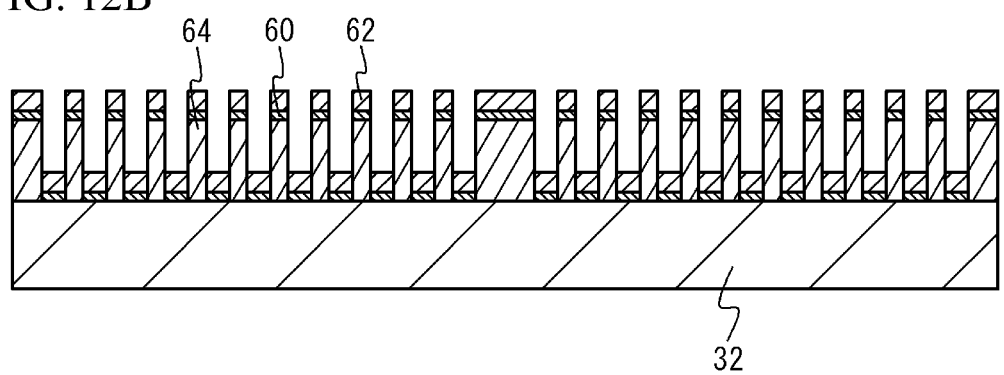
Figure 12C:
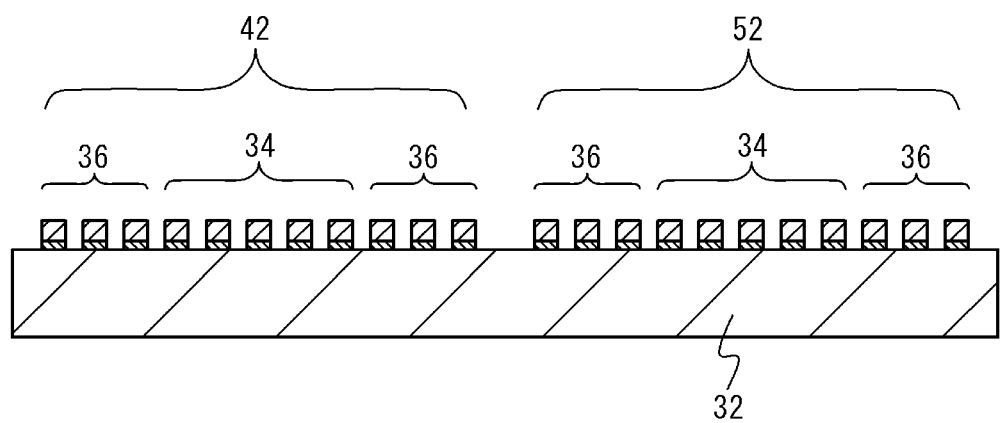

FIG. 12A through FIG. 12C illustrate a schematic cross sectional view of a second method for manufacturing the transmit chip 48. As illustrated in FIG. 12A, the resist 64 is formed on the piezoelectric substrate 32, and is formed into a pattern. In this case, the resist 64 is formed into the pattern so that regions of the piezoelectric substrate 32 where the IDT electrode 34 and the reflection electrode 36 of the first transmit filter 42 and the IDT electrode 34 and the reflection electrode 36 of the second transmit filter 52 are to be formed are exposed.

As illustrated in FIG. 12B, the Ti film 60 and the Al-1% Cu film 62 are formed in this order on the piezoelectric substrate 32 and the resist 64 by a vapor deposition method or the like. As illustrated in FIG. 12C, the resist 64, and the Ti film 60 and the Al-1% Cu film 62 on the resist 64 are removed by a lift-off method. Thus, the IDT electrode 34 and the reflection electrode 36 of the first transmit filter 42 and the IDT electrode 34 and the reflection electrode 36 of the second transmit filter 52 that are composed of the same material, have the same number of layers and have the same thickness are formed on the single piezoelectric substrate 32 together with each other.

As illustrated in FIG. 9, the printed substrate 24 and the substrate 28 has an inner interconnection line 38. Thereby, the transmit chip 48 and the receive chip 58 are electrically connected to the inner interconnection line 38 via the bump 26. A connection terminal 39 that is electrically connected to the inner interconnection line 38 and is to be connected to an outer circuit is provided on a reverse face of the printed substrate 24. When a transmit signal is input to the connection terminal 39 from an outer circuit, the transmit signal is transmitted to the transmit chip 48 via the inner interconnection line 38. When a receive signal is output from the receive chip 58, the receive signal is transmitted to the connection terminal 39 via the inner interconnection line 38.

As mentioned above, as illustrated in FIG. 8, the communication module 14 in accordance with the first embodiment has the two duplexers (the first duplexer 40 and the second duplexer 50) of which transmit band is different from each other and is not overlapped with each other and of which receive band is different from each other and is not overlapped with each other. As illustrated in FIG. 10A, the IDT electrodes 34 of the first transmit filter 42 of the first duplexer 40 and the second transmit filter 52 of the second duplexer 50 are composed of the same material and have the same thickness on the single piezoelectric substrate 32. As illustrated in FIG. 10B, the IDT electrodes 34 of the first receive filter 44 of the first duplexer 40 and the second receive filter 54 of the second duplexer 50 are composed of the same material and have the same thickness on the single piezoelectric substrate 32.

In the first embodiment, the first transmit filter 42 and the second transmit filter 52 are provided in a single chip and act as the transmit chip 48, and the first receive filter 44 and the second receive filter 54 are provided in a single chip and acts as the receive chip 58. In this case, the mounting process can be simplified, compared to the first comparative example. As described with reference to FIG. 11A through FIG. 11C and FIG. 12A through FIG. 12C, the number of manufacturing process of the transmit chip 48 and the receive chip 58 is less than that of manufacturing process of the first transmit-receive chip 226 as described with reference to FIGS. 6A, 6B, 6C, 7A, 7B, and 7C. This results in reducing the mounting cost and the manufacturing cost.

The material, the number of layers, the thickness and so on of the IDT electrode of the transmit filter may be different from those of the IDT electrode of the receive filter, because the first transmit filter 42 and the second transmit filter 52 are provided in a single chip, and the first receive filter 44 and the second receive filter 54 are provided in a single chip. That is, the IDT electrode of the transmit filter may have the two-layer structure of Ti and Al-1% C in order to achieve high power-durability, and the IDT electrode of the receive filter may have the single layer structure of Al-1% cu in order to achieve low electric resistance. Therefore, the high power-durability of the transmit filter and the low transmission loss of the receive filter can be achieved.

As mentioned above, in accordance with the first embodiment, it is possible to provide a communication module having an antenna duplexer having high power-durability and low transmission loss without increasing of cost.

It is possible to locate the transmit filter and the receive filter separately from each other, when the first transmit filter 42 and the second transmit filter 52 act as the transmit chip 48, and the first receive filter 44 and the second receive filter 54 act as the receive chip 58. Thus, isolation characteristic between the transmit filter and the receive filter can be improved.

In the first embodiment, the IDT electrodes 34 of the first transmit filter 42 and the second transmit filter 52 are an electrode having the two-layer structure of Ti and Al-1% Cu, and the IDT electrodes 34 of the first receive filter 44 and the second receive filter 54 are an electrode having the single-layer structure of Al-1% Cu. However, the structure is not limited. It is preferable that the IDT electrodes 34 of the first transmit filter 42 and the second transmit filter 52 are an electrode of which material, number of layer and thickness satisfy the characteristic required for a transmit filter. It is preferable that the IDT electrodes 34 of the first receive filter 44 and the second receive filter 54 are an electrode of which material, number of layer and thickness satisfy the characteristic required for a receive filter. In concrete, it is demanded that the transmit filter has the high power-durability. The high power-durability is not demanded for the receive filter, compared to the transmit filter. However, it is demanded that the receive filter has low electric resistance in order to achieve low transmission loss. Therefore, it is preferable that the IDT electrodes 34 of the first transmit filter 42 and the second transmit filter 52 have power-durability higher than that of the IDT electrodes 34 of the first receive filter 44 and the second receive filter 54. It is preferable that the electric resistance of the IDT electrodes 34 of the first receive filter 44 and the second receive filter 54 is lower than that of the IDT electrodes 34 of the first transmit filter 42 and the second transmit filter 52.

The IDT electrodes 34 of the first transmit filter 42 and the second transmit filter 52 may have another two-layer structure having a lower layer composed of Ti and an upper layer mainly composed of Al, other than the two-layer structure of Ti and Al-1% Cu. The IDT electrodes 34 of the first receive filter 44 and the second receive filter 54 may have a single layer structure mainly composed of Al, other than the single layer structure of Al-1% Cu.

In the first embodiment, the first duplexer 40 is a duplexer of the Band 5 of the WCDMA system, and the second duplexer 50 is a duplexer of the Band 8 of the WCDMA system. However, the structure is not limited. When each transmit band of the transmit filters is close to each other, the IDT electrodes of the transmit filter may be composed of the same material and have the same thickness on a single piezoelectric substrate. When each receive band of the receive filters is close to each other, the IDT electrode of the receive filter may be composed of the same material and have the same thickness on a single piezoelectric substrate. It is therefore preferable that the transmit band of the first duplexer 40 is close to that of the second duplexer 50, and the receive band of the first duplexer 40 is close to that of the receive band of the second duplexer 50.

With reference to frequency bands of the WCDMA system, each transmit band is close to each other, and each receive band is close to each other, among the Band 1 through the Band 4 and the Band 9 and among the Band 5, the Band 6 and the Band 8. Therefore, the first duplexer 40 may be one of duplexers of the Band 1 through the Band 4 and the Band 9, and the second duplexer 50 may be another of the Band 1 through the Band 4 and the Band 9. Alternatively, the first duplexer 40 may be one of duplexers of the Band 5, the Band 6 and the Band 8, and the second duplexer 50 may be another of the Band 5, the Band 6 and the Band 8.

TABLE 1

| BAND | CENTER VALUE OF TRANSMIT BAND (MHz) | CENTER VALUE OF RECEIVE BAND (MHz) | BANDWIDTH (MHz) | FRACTIONAL BANDWIDTH (RECEIVE BAND) |
|---|---|---|---|---|
| 1 | 1950 | 2140 | 60 | 2.8% |
| 2 | 1880 | 1960 | 60 | 3.1% |
| 3 | 1747.5 | 1842.5 | 75 | 4.1% |
| 4 | 1732.5 | 2132.5 | 45 | 2.1% |
| 5 | 836.5 | 881.5 | 25 | 2.8% |
| 6 | 835 | 880 | 10 | 1.1% |
| 7 | 2535 | 2655 | 70 | 2.6% |
| 8 | 897.5 | 942.5 | 35 | 3.7% |
| 9 | 1767.4 | 1862.4 | 35 | 1.9% |
| 10 | 1740 | 2140 | 60 | 2.8% |

However, it may be difficult to provide IDT electrodes composed of the same material and having the same thickness on a single piezoelectric substrate when a fractional bandwidth of the receive band ((bandwidth of receive band/center value of receive band)×100) is large or when an interval between the transmit band and the receive band is small, even if each transmit-receive band is close to each other. In view of this point, it is preferable that the first duplexer 40 and the second duplexer 50 are one of combinations of the Band 1 and the Band 2, the Band 2 and the Band 3, and the Band 5 and the Band 8.

In the first embodiment, as illustrated in FIG. 10A and FIG. 10B, the IDT electrodes 34 of the first transmit filter 42 and the second transmit filter 52 are composed of the same material and have the same thickness on the single piezoelectric substrate 32, and the IDT electrodes 34 of the first receive filter 44 and the second receive filter 54 are composed of the same material and have the same thickness on the single piezoelectric substrate 32. In other words, the IDT electrodes of the transmit filters of the first duplexer 40 and the second duplexer 50 having a different transmit band are composed of the same material and have the same thickness on the single piezoelectric substrates, and the IDT electrodes of the receive filters of the first duplexer 40 and the second duplexer 50 having a different transmit band are composed of the same material and have the same thickness. However, the structure is not limited. At least one of each IDT electrode of the transmit filters of the first duplexer 40 and the second duplexer 50 and each IDT electrode of the receive filters of the first duplexer 40 and the second duplexer 50 has only to be composed of the same material and have the same thickness on the single piezoelectric substrate.

As mentioned above, it is preferable that the transmit band of the first duplexer 40 is close to that of the second duplexer 50, if each IDT electrode of the transmit filters of the first duplexer 40 and the second duplexer 50 is composed of the same material and has the same thickness on the single piezoelectric substrate. Therefore, with reference to Table 1, it is preferable that the transmit filters of the first duplexer 40 and the second duplexer 50 are of two of the group including the Band 1 through the Band 4 and the Band 9 of the WCDMA system or two of the group including the Band 5, the Band 6 and the Band 8 of the WCDMA system. In view of the fractional bandwidth or the interval between the transmit band and the receive band, it is preferable that the transmit filters of the first duplexer 40 and the second duplexer 50 are any of the group of the Band 1 and the Band 2, the group of the Band 2 and the Band 3, the group of the Band 2 and the Band 4, and the group of the Band 5 and the Band 8.

Similarly, it is preferable that the receive band of the first duplexer 40 is close to that of the second duplexer 50, if each IDT electrode of the receive filters of the first duplexer 40 and the second duplexer 50 is composed of the same material and has the same thickness on the single piezoelectric substrate. Therefore, with reference to Table 1, it is preferable that the receive filters of the first duplexer 40 and the second duplexer 50 are of two of the group including the Band 1 through the Band 4 and the Band 9 of the WCDMA system or two of the group including the Band 5, the Band 6 and the Band 8 of the WCDMA system. In view of the fractional bandwidth or the interval between the transmit band and the receive band, it is preferable that the receive filters of the first duplexer 40 and the second duplexer 50 are of any of the group of the Band 1 and the Band 2, the group of the Band 2 and the Band 3, the group of the Band 1 and the Band 4, and the group of the Band 5 and the Band 8.

Figure 13:
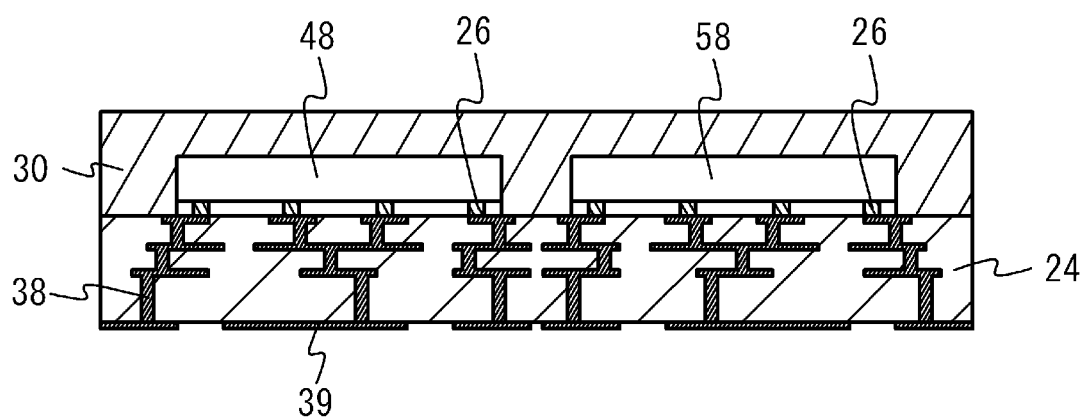
FIG. 13 illustrates a schematic cross sectional view of a communication module in accordance with a modified embodiment of the first embodiment.

In the first embodiment, as illustrated in FIG. 9, the transmit package 46 having the transmit chip 48 and the receive package 56 having the receive chip 58 are mounted on the printed substrate 24. However, the structure is not limited. For example, the transmit chip 48 and the receive chip 58 may be directly mounted on the printed substrate 24. FIG. 13 illustrates a schematic cross sectional view of a communication module in accordance with a modified embodiment of the first embodiment. As illustrated in FIG. 13, the transmit chip 48 is directly flip-chip mounted on the printed substrate 24 with use of the bump 26. Similarly, the receive chip 58 is directly flip-chip mounted on the printed substrate 24 with use of the bump 26. The transmit chip 48 and the receive chip 58 are sealed by the seal portion 30 provided on the printed substrate 24.

In accordance with the modified embodiment, the substrate 28 is not needed. Therefore, the cost may be reduced, compared to the first embodiment. And, the height of the communication module can be reduced, compared to the first embodiment.

In the first embodiment, the first transmit filter 42 and the second transmit filter 52 are a surface acoustic wave filter of a ladder type, and the first receive filter 44 and the second receive filter 54 are a surface acoustic wave filter of a double mode coupling type. However, the structure is not limited. The first transmit filter 42 and the second transmit filter 52 may be the surface acoustic wave filter of the double mode coupling type. The first receive filter 44 and the second receive filter 54 may be the surface acoustic wave filter of the ladder type. Other than the surface acoustic wave filter, an acoustic wave filter having an IDT electrode such as a boundary acoustic wave filter or a love wave filter may be used.

Second Embodiment

Figure 14:
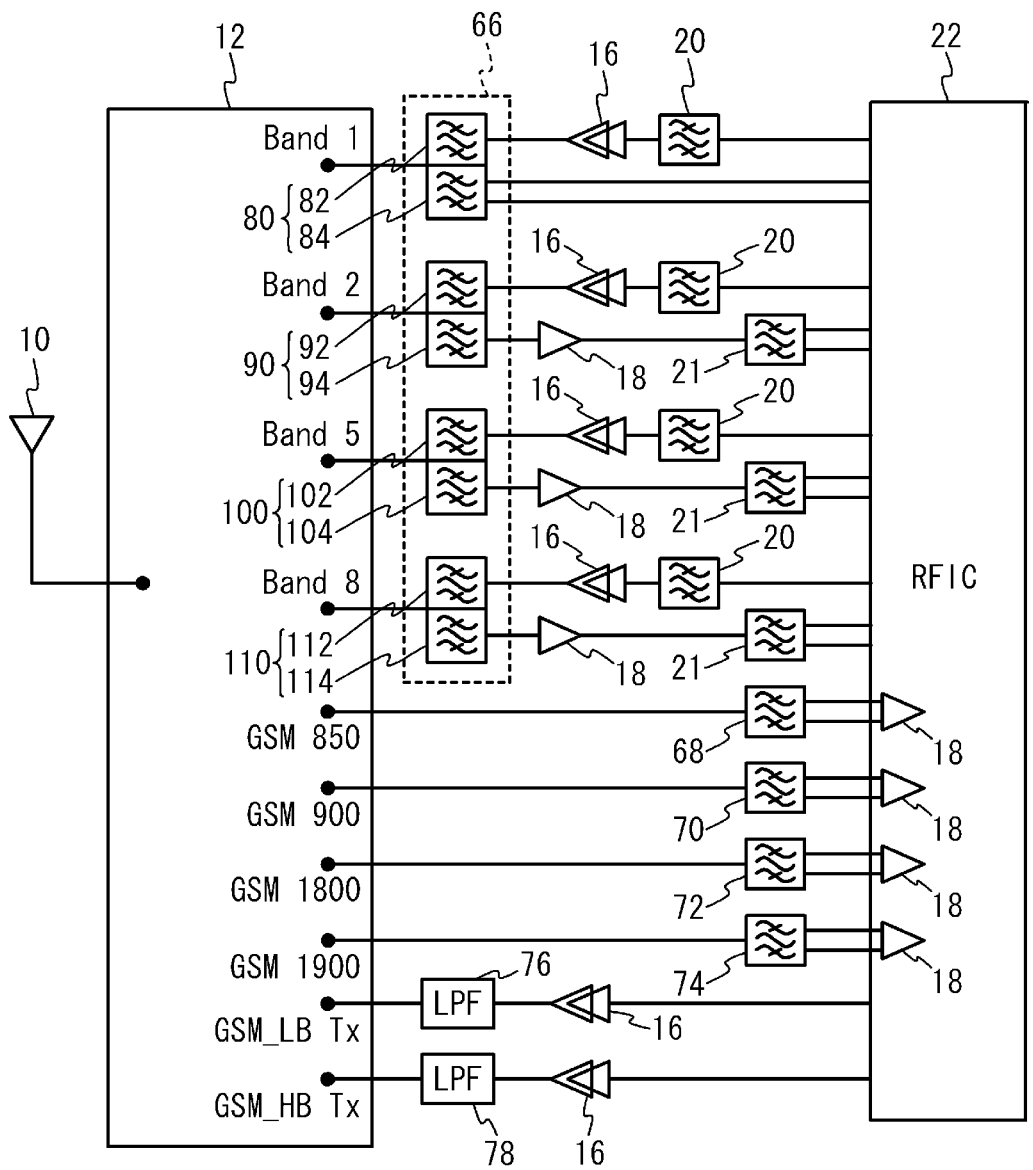
FIG. 14 illustrates a block diagram of a wireless communication portion having a communication module in accordance with a second embodiment.

FIG. 14 illustrates a block diagram of a wireless communication portion having a communication module in accordance with a second embodiment. As illustrated in FIG. 14, the wireless communication portion has the antenna 10, the antenna switch 12, a communication module 66 in accordance with the second embodiment, the power amplifier 16, the low noise amplifier 18, the filters 20 and 21, the RFIC 22, receive filters 68, 70, 72 and 74 of 850 MHz band, 900 MHz band. 1800 MHz band and 1900 MHz band of GSM (Global System for Mobile Communications), and low pass filters 76 and 78. The low pass filter 76 has a function of a transmit filter covering the 850 MHz band and the 900 MHz band of the GSM. The low pass filter 78 has a function of a transmit filter covering the 1800 MHz band and the 1900 MHz band of the GSM.

The communication module 66 of the second embodiment has a third duplexer 80 of the Band 1 of the WCDMA system, a fourth duplexer 90 of the Band 2, a fifth duplexer 100 of the Band 5, and a sixth duplexer 110 of the Band 8. The third duplexer 80 has a third transmit filter 82 and a third receive filter 84. The fourth duplexer 90 has a fourth transmit filter 92 and a fourth receive filter 94. The transmit band of the third transmit filter 82 is 1920 to 1980 MHz. The receive band of the third receive filter 84 is 2110 to 2170 MHz. The transmit band of the fourth transmit filter 92 is 1850 to 1910 MHz. The receive band of the fourth receive filter 94 is 1930 to 1990 MHz.

The fifth duplexer 100 has a fifth transmit filter 102 and a fifth receive filter 104. The sixth duplexer 110 has a sixth transmit filter 112 and a sixth receive filter 114. The transmit band of the fifth transmit filter 102 is 824 to 849 MHz. The receive band of the fifth receive filter 104 is 869 to 894 MHz. The transmit band of the sixth transmit filter 112 is 880 to 915 MHz. The receive band of the sixth receive filter 114 is 925 to 960 MHz. Thus, the wireless communication portion illustrated in FIG. 14 is used for a mobile phone unit covering the Bands 1, 2, 5 and 8 of the WCDMA and the 850 MHz band, the 900 MHz band, the 1800 MHz band and the 1900 MHz band of the GSM.

The third duplexer 80, the fourth duplexer 90, the fifth duplexer 100 and the sixth duplexer 110 are connected to the antenna switch 12 via antenna terminals (Band 5, Band 8, Band 1 and Band 2). The receive filters 68 to 74 are connected to the antenna switch 12 via antenna terminals (GSM 850, GSM 900, GSM 1800, and GSM 1900). And, the low pass filters 76 and 78 are connected to the antenna switch 12 via antenna terminals (GSM_LB Tx and GSM_HB Tx). The antenna switch 12 is connected to the antenna 10. Thus, the antenna switch is capable of selecting an antenna terminal that is electrically connected to the antenna 10.

The third transmit filter 82, the fourth transmit filter 92, the fifth transmit filter 102 and the sixth transmit filter 112 are connected to the RFIC 22 via the power amplifier 16 and the filter 20. The filter 20 connected to the third transmit filter 82 is a band pass filter that selectively allows passing of the same pass band as the third transmit filter 82. The filter 20 connected to the fourth transmit filter 92 is a band pass filter that selectively allows passing of the same pass band as the fourth transmit filter 92. Similarly, the filter 20 connected to the fifth transmit filter 102 is a band pass filter that selectively allows passing of the same pass band as the fifth transmit filter 102. The filter 20 connected to the sixth transmit filter 112 is a band pass filter that selectively allows passing of the same pass band as the sixth transmit filter 112.

The fourth receive filter 94, the fifth receive filter 104 and the sixth receive filter 114 are connected to the RFIC 22 via the low noise amplifier 18 and the filter 21. The filter 21 connected to the fourth receive filter 94 is a band pass filter that selectively allows passing of the same pass band as the fourth receive filter 94. The filter 21 connected to the fifth receive filter 104 is a band pass filter that selectively allows passing of the same pass band as the fifth receive filter 104. Similarly, the filter 21 connected to the sixth receive filter 114 is a band pass filter that selectively allows passing of the same pass band as the sixth receive filter 114. It is not always necessary for the third receive filter 84 to be connected to the low noise amplifier 18 and the filter 21.

The transmitting and receiving of a signal of the WCDMA is the same as the first embodiment. Therefore, the explanation is omitted. Here, a description will be given of transmitting and receiving of a signal of the GSM. The RFIC 22 outputs a transmit signal of high frequency to the power amplifier 16. The power amplifier 16 amplifies the transmit signal and outputs the amplified transmit signal to the low pass filter 76 or the low pass filter 78. The low pass filter 76 or the low pass filter 78 filters the transmit signal and outputs the filtered transmit signal to the antenna terminal (GSM_LB Tx or GSM_HB Tx) of the antenna switch 12. A transmit signal of the 850 MHz band and another transmit signal of the 900 MHz band are output to an identical antenna terminal GSM_LB Tx. A transmit signal of the 1800 MHz band and another transmit signal of the 1900 MHz band are output to an identical antenna terminal GSM_HB Tx. The antenna switch 12 outputs a receive signal to the antenna terminal (GSM 850, GSM 900, GSM 1800 or GSM 1900). The receive filters 68 to 74 filter the receive signal and output the filtered receive signal to the RFIC 22. The receive filters 68 to 74 may output a balanced signal. The RFIC 22 has the low noise amplifier 18. The low noise amplifier 18 amplifies the receive signal.

Figure 15:
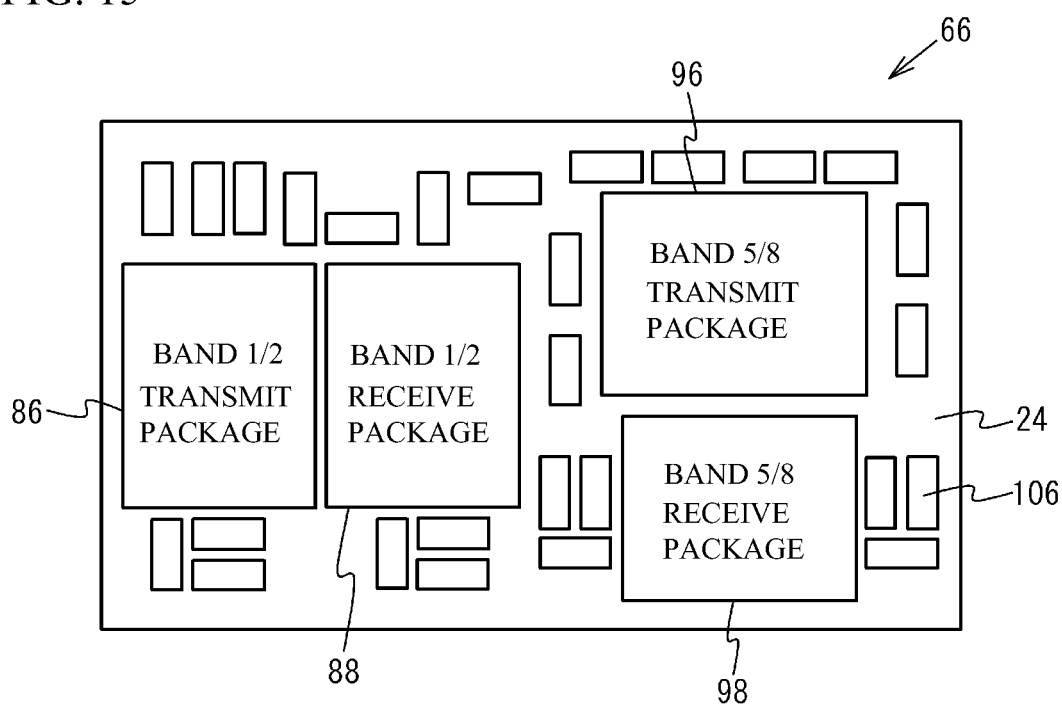
FIG. 15 illustrates a block diagram of the communication module in accordance with the second embodiment.

FIG. 15 illustrates a block diagram of the communication module in accordance with the second embodiment. As illustrated in FIG. 15, the transmit-receive band of the Band 1 is close to that of the Band 2 (with reference to Table 1 of the first embodiment). Therefore, the IDT electrodes of the third transmit filter 82 and the fourth transmit filter 92 may be composed of the same material (for example, lamination structure of Ti and Al-1% Cu) and have the same thickness on the single piezoelectric substrate (as illustrated in FIG. 10A). That is, the third transmit filter 82 and the fourth transmit filter 92 may be provided in a single chip. A transmit package on which the single chip is mounted is hereinafter referred to as a Band 1/2 transmit package 86. The Band 1/2 transmit package 86 is mounted on the printed substrate 24. The IDT electrodes of the third receive filter 84 and the fourth receive filter 94 may be composed of the same material (for example, a single layer structure of Al-1% Cu) and have the same thickness (as illustrated in FIG. 10B). That is, the third receive filter 84 and the fourth receive filter 94 may be provided in a single chip. A receive package on which the single chip is mounted is hereinafter referred to as a Band 1/2 receive package 88. The Band 1/2 receive package 88 is mounted on the printed substrate 24.

Similarly, the transmit-receive band of the Band 5 is close to that of the Band 8 (with reference to Table 1 of the first embodiment). Therefore, the IDT electrodes of the fifth transmit filter 102 and the sixth transmit filter 112 may be composed of the same material (for example, lamination structure of Ti and Al-1% Cu) and have the same thickness on the single piezoelectric substrate (as illustrated in FIG. 10A). That is, the fifth transmit filter 102 and the sixth transmit filter 112 may be provided in a single chip. A transmit package on which the single chip is mounted is hereinafter referred to as a Band 5/8 transmit package 96. The Band 5/8 transmit package 96 is mounted on the printed substrate 24. The IDT electrodes of the fifth receive filter 104 and the sixth receive filter 114 may be composed of the same material (for example, a single layer structure of Al-1% Cu) and have the same thickness (as illustrated in FIG. 10B). That is, the fifth receive filter 104 and the sixth receive filter 114 may be provided in a single chip. A receive package on which the single chip is mounted is hereinafter referred to as a Band 5/8 receive package 98. The Band 5/8 receive package 98 is mounted on the printed substrate 24.

A chip component 106 such as a conductor or a inductor is mounted on the printed substrate 24 around the Band 1/2 transmit package 86, the Band 1/2 receive package 88, the Band 5/8 transmit package 96 and the Band 5/8 receive package 98.

In accordance with the communication module 66 of the second embodiment, as illustrated in FIG. 14, there are provided the four duplexers (the third duplexer 80, the fourth duplexer 90, the fifth duplexer 100 and the sixth duplexer 110) of which transmit band is different from each other and of which receive band is different from each other. As illustrated in FIG. 15, the IDT electrodes of the transmit filters of the third duplexer 80 and the fourth duplexer 90 (two of the four duplexers) are composed of the same material and have the same thickness on the single piezoelectric substrate, and the IDT electrodes of the receive filters of the third duplexer 80 and the fourth duplexer 90 are composed of the same material and the same thickness. And, the IDT electrodes of the transmit filters of the fifth duplexer 100 and the sixth duplexer 110 (two of the four duplexers) are composed of the same material and have the same thickness on the single piezoelectric substrate, and the IDT electrodes of the receive filters of the fifth duplexer 100 and the sixth duplexer 110 are composed of the same material and the same thickness. Thus, the number of processes of the mounting process and the manufacturing process may be reduced, and the cost may be reduced, as well as the first embodiment. The IDT electrode of the transmit filter may have a film structure achieving the high power-durability, and the IDT electrode of the receive filter may have a film structure achieving low electric resistance. Therefore, in accordance with the second embodiment, it is possible to provide a communication module having an antenna duplexer of high power-durability and low transmission loss.

It is preferable that the IDT electrodes of the transmit filters of at least two duplexers (the fifth duplexer 100 and the sixth duplexer 110) of which transmit band is the closest to each other are composed of the same material and have the same thickness on the single piezoelectric substrate, in the four duplexers (the third duplexer 80, the fourth duplexer 90, the fifth duplexer 100 and the sixth duplexer 110). Similarly, the IDT electrodes of the receive filters of at least two duplexers (the fifth duplexer 100 and the sixth duplexer 110) of which receive band is the closest to each other are composed of the same material and have the same thickness on the single piezoelectric substrate.

Figure 16:
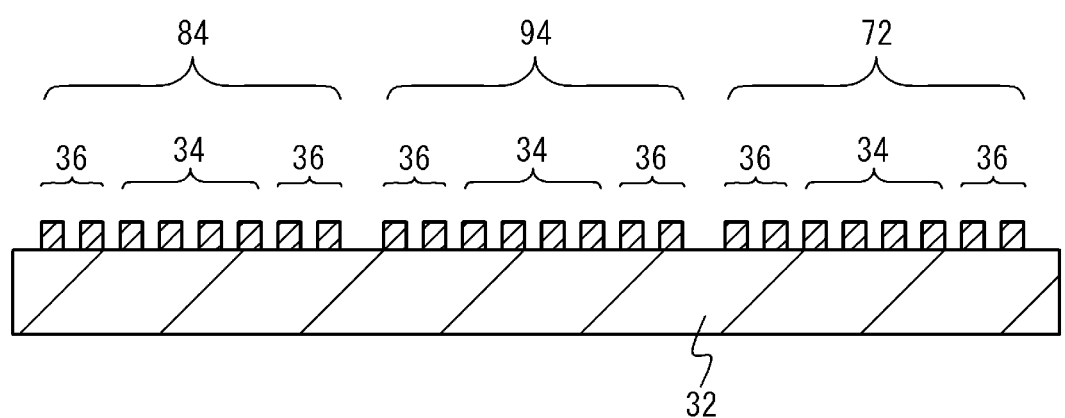
FIG. 16 illustrates a schematic cross sectional view of a single receive chip in which receive chips of a third duplexer and a fourth duplexer and a receive chip of GSM are provided.

As illustrated in FIG. 14, the wireless communication portion has the receive filter 72 of the GSM 1800 MHz band. The receive band of the receive filter 72 is different from the receive band of the receive filters of the third duplexer 80 and the fourth duplexer 90 acting as the duplexer of the Band 1 and the duplexer of the Band 2 of the WCDMA system and is not overlapped with the receive band, but is close to the receive band. Therefore, the IDT electrodes of the receive filters of the third duplexer 80 and the fourth duplexer 90 and the IDT electrodes of the receive filter 72 may be composed of the same material and have the same thickness on the single piezoelectric substrate. FIG. 16 illustrates a schematic cross sectional view of a single receive chip in which the receive filters of the third duplexer 80 and the fourth duplexer 90 and the receive filter 72 are provided. As illustrated in FIG. 16, the IDT electrode 34 of the third receive filter 84 of the third duplexer 80, the IDT electrode 34 of the fourth receive filter 94 of the fourth duplexer 90, and the IDT electrode 34 of the receive filter 72 are composed of the same material and have the same thickness on the single piezoelectric substrate 32. Thus, when a receive filter of which receive band is different from that of another receive filter of a duplexer is provided, an IDT electrode of the receive filter and another IDT electrode of the another receive filter of the duplexer may be composed of the same material and have the same thickness on a single piezoelectric substrate.

The communication module 14 of the first embodiment has two duplexers, and the communication module 66 of the second embodiment has four duplexers. However, the structure is not limited. A plurality of duplexers (two, three, four, five and so on) have only to be provided. In the first embodiment and the second embodiment, the IDT electrodes of the transmit filters of the two duplexers of which transmit band is different from each other are composed of the same material and have the same thickness on the single piezoelectric substrate, and the IDT electrodes of the receive filters of the two duplexers of which receive band is different from each other are composed of the same material and have the same thickness on the single piezoelectric substrate. However, the structure is not limited. The IDT electrodes of the transmit filters of at least two duplexers of the communication module (such as three or four duplexers) of which transmit band is different from each other may be composed of the same material and have the same thickness on the single piezoelectric substrate, and the IDT electrodes of the receive filters of the at least two duplexers of the communication module of which receive band is different from each other may be composed of the same material and have the same thickness on the single piezoelectric substrate. Alternatively, the IDT electrodes of the transmit filters of at least two duplexers may be composed of the same material and have the same thickness on the single piezoelectric substrate, and the IDT electrodes of the receive filters of at least two duplexers may be separately provided on piezoelectric substrates. On the contrary, the IDT electrodes of the receive filters of at least two duplexers may be composed of the same material and have the same thickness on the single piezoelectric substrate, and the IDT electrodes of the transmit filters of at least two duplexers may be separately provided on piezoelectric substrates.

Figure 17A:
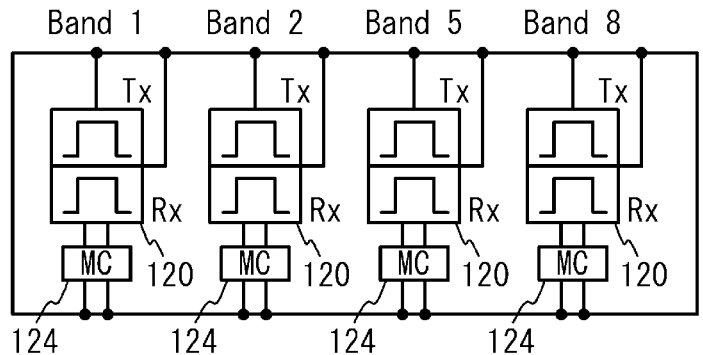
FIG. 17A through FIG. 17C illustrate a block diagram of a communication module having a plurality of duplexers.
Figure 17B:
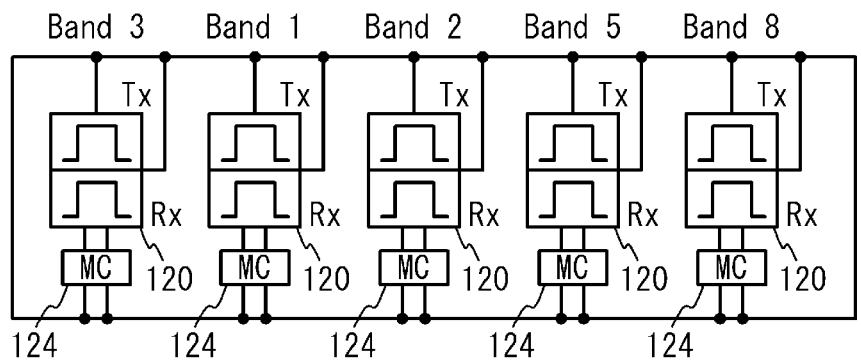
Figure 17C:
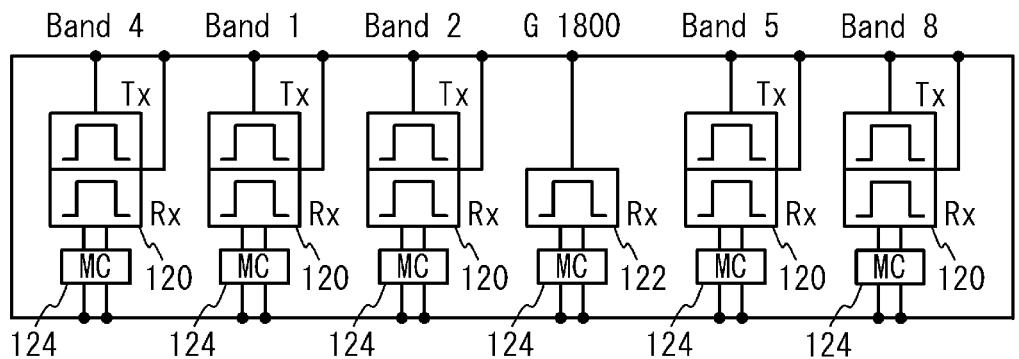

FIG. 17A through FIG. 17C illustrate a block diagram of a communication module having a plurality of duplexers. As illustrated in FIG. 17A, the communication module has a plurality of duplexers 120 of the Band 1, the Band 2, the Band 5 and the Band 8. The transmit band of the Band 1 is close to that of the Band 2. Therefore, the IDT electrodes of the transmit filters of the duplexers 120 of the Band 1 and the Band 2 may be composed of the same material and have the same thickness on the single piezoelectric substrate, and the IDT electrodes of the receive filters of the duplexers 120 of the Band 1 and the Band 2 may be composed of the same material and have the same thickness on the single piezoelectric substrate. The transmit-receive band of the Band 5 is close to that of the Band 8. Therefore, the IDT electrodes of the transmit filters of the duplexers 120 of the Band 5 and the Band 8 may be composed of the same material and have the same thickness on the single piezoelectric substrate, and the IDT electrodes of the receive filters of the duplexers 120 of the Band 5 and the Band 8 may be composed of the same material and have the same thickness on the single piezoelectric substrate.

As illustrated in FIG. 17B, the communication module may have a plurality of duplexers 120 of the Band 3, the Band 1, the Band 2, the Band 5 and the Band 8. The transmit-receive bands of the Band 1 through the Band 3 are close to each other. Therefore, the IDT electrodes of the transmit filters of the duplexers 120 of the Band 1, the Band 2 and the Band 3 may be composed of the same material and have the same thickness on the single piezoelectric substrate, and the IDT electrodes of the receive filters of the duplexers 120 of the Band 1, the Band 2 and the Band 3 may be composed of the same material and have the same thickness. The transmit-receive band of the Band 5 is close to that of the Band 8. Therefore, the IDT electrodes of the receive filters of the duplexers 120 of the Band 5 and the Band 8 may be composed of the same material and have the same thickness on the single piezoelectric substrate, and the IDT electrodes of the receive filters of the duplexers 120 of the Band 5 and the Band 8 may be composed of the same material and have the same thickness.

As illustrated in FIG. 17C, the communication module may have a plurality of the duplexers 120 of the Band 4, the Band 1, the Band 2, the Band 5 and the Band 8 and have a receive filter 122 of the GSM 1800 MHz band. The transmit bands of the Band 1, the Band 2 and the Band 4 are close to each other. Therefore, the IDT electrodes of the transmit filters of the duplexers 120 of the Band 1, the Band 2 and the Band 4 may be composed of the same material and have the same thickness on the single piezoelectric substrate. The receive bands of the Band 1, the Band 2, the Band 4 and the GSM 1800 MHz are close to each other. Therefore, the IDT electrodes of the receive filters of the duplexers 120 of the Band 1, the Band 2 and the Band 4 and the IDT electrode of the receive filter 122 of the GSM 1800 MHz may be composed of the same material and have the same thickness on the single piezoelectric substrate. The transmit-receive bands of the Band 5 and the Band 8 are close to each other. Therefore, the IDT electrodes of the transmit filters of the duplexers 120 of the Band 5 and the Band 8 may be composed of the same material and have the same thickness on the single piezoelectric substrate, and the IDT electrodes of the receive filters of the duplexers 120 of the Band 5 and the Band 8 may be composed of the same material and have the same thickness on the single piezoelectric substrate. FIG. 17A through FIG. 17C illustrate an example where a matching circuit 124 is connected to the receive filter of each duplexer and the receive filter of the GSM 1800 MHz band.

The present invention is not limited to the specifically described embodiments, but other embodiments and variations may be made without departing from the scope of the claimed invention.

What is claimed is:

1. A communication module comprising
a plurality of duplexers for different transmit-receive bands, each duplexer having a first filter and a second filter, the first filter of each duplexer being one of a transmit filter and a receive filter, and the second filter of each duplexer being another of the transmit filter and the receive filter,
wherein IDT electrodes of the first filters of at least two of the plurality of duplexers having different transmit-receive bands are composed of a same material, have a same thickness, and are provided on a same single piezoelectric substrate,
wherein IDT electrodes of the second filters of said at least two of the plurality of duplexers are provided on one or more of piezoelectric substrates that are different from said single piezoelectric substrate on which the IDT electrodes of the first filters are provided, and
wherein the IDT electrodes of the first filters of said at least two of the plurality of duplexers and the IDT electrodes of the second filters of said at least two of the plurality of duplexers are composed of different materials and have different thickness.

2. The communication module as claimed in claim 1, wherein:
the IDT electrodes of the second filters of said at least two of the plurality of duplexers are composed of a same material, have a same thickness, and are provided on a same single piezoelectric substrate that is different from said single piezoelectric substrate on which the IDT electrodes of the first filters are provided.

3. The communication module as claimed in claim 1, wherein a power durability of each of the IDT electrodes of the transmit filters is higher than a power durability of each of the IDT electrodes of the receive filters.

4. The communication module as claimed in claim 1, wherein an electric resistance of each of the IDT electrodes of the receive filters is less than an electric resistance of each of the IDT electrodes of the transmit filters.

5. The communication module as claimed in claim 1, further comprising another receive filter having a receive band that is different from receive bands of the receive filters in the plurality of duplexers,
wherein the first filters are the receive filters, and IDT electrodes of said another receive filter are composed of the same material, have the same thickness and are provided on the same single piezoelectric substrate as the IDT electrodes of the first filters, which are the receive filters, of said at least two of the plurality of duplexers.

6. The communication module as claimed in claim 1, wherein the at least two of the plurality of duplexers include transmit filters of Band 1 and Band 2, Band 2 and Band 3, Band 2 and Band 4, or Band 5 and Band 8 of WCDMA system.

7. The communication module as claimed in claim 1, wherein the at least two of the plurality of duplexers include receive filters of Band 1 and Band 2, Band 2 and Band 3, Band 1 and Band 4, or Band 5 and Band 8 of WCDMA system.

8. A communication module comprising:
a plurality of duplexers for different transmit-receive bands, each duplexer having a first filter and a second filter, the first filter of each duplexer being one of a transmit filter and a receive filter, and the second filter of each duplexer being another of the transmit filter and the receive filter; and
another receive filter having a receive band that is different from receive bands of the receive filters in the plurality of duplexers,
wherein IDT electrodes of the first filters of at least two of the plurality of duplexers having different transmit-receive bands are composed of a same material, have a same thickness, and are provided on a same single piezoelectric substrate,
wherein IDT electrodes of the second filters of said at least two of the plurality of duplexers are provided on one or more of piezoelectric substrate that are different from said single piezoelectric substrate on which the IDT electrodes of the first filters are provided, and
wherein the first filters are the receive filter, and IDT electrodes of said another receive filter are composed of the same material, have the same thickness, and are provided on the same single piezoelectric substrate as the IDT electrodes of the first filters, which are the receive filters, of said at least two of the plurality of duplexers.

9. A communication module comprising:
a plurality of duplexers for different transmit-receive bands, each duplexer having a first filter and a second filter, the first filter of each duplexer being one of a transmit filter and a receive filter, and the second filter of each duplexer being another of the transmit filter and the receive filter,
wherein IDT electrodes of the first filters of at least two of the plurality of duplexers having different transmit-receive bands are composed of a same material, have a same thickness, and are provided on a same single piezoelectric substrate,
wherein IDT electrodes of the second filters of said at least two of the plurality of duplexers are provided on one or more of piezoelectric substrate that are different from said single piezoelectric substrate on which the IDT electrodes of the first filters are provided, and
wherein power durability of the IDT electrodes of the transmit filters is higher than power durability of the IDT electrodes of the receive filters.

10. A communication module comprising:
a plurality of duplexers for different transmit-receive bands, each duplexer having a first filter and a second filter, the first filter of each duplexer being one of a transmit filter and a receive filter, and the second filter of each duplexer being another of the transmit filter and the receive filter,
wherein IDT electrodes of the first filters of at least two of the plurality of duplexers having different transmit-receive bands are composed of a same material, have a same thickness, and are provided on a same single piezoelectric substrate,
wherein IDT electrodes of the second filters of said at least two of the plurality of duplexers are provided on one or more of piezoelectric substrate that are different from said single piezoelectric substrate on which the IDT electrodes of the first filters are provided, and
wherein an electric resistance of each of the IDT electrodes of the receive filters is less than an electric resistance of each of the IDT electrodes of the transmit filters.

* * * * *